United States Patent [19]

Hoffman et al.

[11] Patent Number: 5,578,869
[45] Date of Patent: Nov. 26, 1996

[54] COMPONENTS FOR HOUSING AN INTEGRATED CIRCUIT DEVICE

[75] Inventors: Paul R. Hoffman, Modesto, Calif.; Deepak Mahulikar, Madison, Conn.; George A. Brathwaite, Hayward; Dawit Solomon, Manteca, both of Calif.; Arvind Parthasarathi, North Branford, Conn.

[73] Assignee: Olin Corporation, Manteca, Calif.

[21] Appl. No.: 413,149

[22] Filed: Mar. 29, 1994

[51] Int. Cl.[6] .......................... H01L 23/52; H01L 23/34; H01L 23/48; H01L 23/04
[52] U.S. Cl. .......................... 257/691; 257/693; 257/713; 257/730; 257/784
[58] Field of Search .................. 257/691, 704, 257/701, 778, 710, 708, 676, 737, 675, 684, 693, 706, 712, 713, 714, 722, 730, 784

[56] References Cited

U.S. PATENT DOCUMENTS

| | | | |
|---|---|---|---|
| 3,324,224 | 6/1967 | Thibodeau | 174/35 |
| 4,313,492 | 2/1982 | Andros et al. | 257/715 |
| 4,335,781 | 6/1982 | Duffy | 361/385 |
| 4,480,262 | 10/1984 | Butt | 257/684 |
| 4,561,040 | 12/1986 | Eastman et al. | 361/385 |
| 4,603,374 | 7/1986 | Wasielewski | 361/389 |
| 4,727,455 | 2/1988 | Neidig et al. | 361/385 |
| 4,740,866 | 4/1988 | Kajiwara et al. | 361/382 |
| 4,806,503 | 2/1989 | Yoshida et al. | 257/676 |
| 4,825,284 | 4/1989 | Soga et al. | 257/714 |
| 4,888,449 | 12/1989 | Crane et al. | 257/678 |
| 4,897,508 | 1/1990 | Mahulikar et al. | 257/675 |
| 4,912,548 | 3/1990 | Shanker et al. | 257/714 |
| 4,939,316 | 7/1990 | Mahulikar et al. | 257/678 |
| 4,949,219 | 8/1990 | Moriizumi et al. | 257/714 |
| 4,961,106 | 10/1990 | Butt et al. | 257/678 |
| 4,967,260 | 10/1990 | Butt | 257/666 |
| 5,015,803 | 5/1991 | Mahulikar et al. | 257/678 |
| 5,018,005 | 5/1991 | Lin et al. | 361/398 |
| 5,023,398 | 6/1991 | Mahulikar et al. | 257/684 |
| 5,025,114 | 6/1991 | Braden | 257/684 |
| 5,055,967 | 10/1991 | Sukonnik et al. | 361/387 |
| 5,066,368 | 11/1991 | Pasqualoni et al. | 204/58 |
| 5,073,521 | 12/1991 | Braden | 257/684 |
| 5,103,292 | 4/1992 | Mahulikar | 257/678 |
| 5,175,613 | 12/1992 | Barker, III et al. | 257/713 |
| 5,184,211 | 2/1993 | Fox | 257/706 |
| 5,189,505 | 2/1993 | Bartelink | 257/776 |
| 5,214,308 | 5/1993 | Nishiguchi et al. | 257/692 |
| 5,216,283 | 6/1993 | Lin | 257/787 |
| 5,235,209 | 8/1993 | Shimizu et al. | 257/692 |
| 5,256,205 | 10/1993 | Schmitt, III et al. | 118/723 |
| 5,284,706 | 2/1994 | O'Donnelly | 428/330 |
| 5,291,064 | 3/1994 | Kurokawa | 257/714 |
| 5,323,292 | 6/1994 | Brzezinski | 257/707 |
| 5,324,569 | 6/1994 | Nagesh et al. | 428/198 |
| 5,334,857 | 8/1994 | Mennitt et al. | 257/692 |
| 5,352,926 | 10/1994 | Andrew | 257/717 |
| 5,353,193 | 10/1994 | Chia et al. | 257/722 |
| 5,380,212 | 1/1995 | Smeenge, Jr. et al. | 439/86 |

FOREIGN PATENT DOCUMENTS

| | | | |
|---|---|---|---|
| 60-136348 | 7/1985 | Japan | 257/712 |
| 4216655 | 8/1992 | Japan | 257/712 |

*Primary Examiner*—Mahshid Saadat
*Assistant Examiner*—Jhihan Clark
*Attorney, Agent, or Firm*—Gregory S. Rosenblatt

[57] ABSTRACT

There is provided a metallic component for an electronic package. The component is coated with an electrically non-conductive layer and has a plurality of conductive circuit traces are formed on a surface. The circuit traces are soldered directly to the input/output pads of an integrated circuit device and to a second plurality of circuit traces. The component may include a heat sink to enhance dissipation of heat from an encapsulated integrated circuit device.

34 Claims, 11 Drawing Sheets

COMPONENTS FOR HOUSING AN INTEGRATED CIRCUIT DEVICE

BACKGROUND OF THE INVENTION

1. Field of the Invention

This invention relates to components for electronic packages. More particularly, there are provided metallic substrates and heat sinks useful in ball grid array electronic packages.

2. Description of Related Art

Microelectronic devices are typically manufactured from a semiconductor material such as silicon, germanium or gallium/arsenide. The semiconductor material is fashioned into a die, a generally rectangular structure having circuitry formed on one surface. Along the periphery of that electrically active surface are input/output pads to facilitate electrical interconnection to external circuitry.

The semiconductor device is brittle and requires protection from moisture and mechanical damage. This protection is provided by an electronic package. The electronic package further contains an electrically conductive means to transport electrical signals between the semiconductor device and the external circuitry.

One electronic package is disclosed in U.S. Pat. No. 4,939,316 to Mahulikar et al, which is incorporated by reference in its entirety herein. The patent discloses separate anodized aluminum or aluminum alloy base and cover components defining a cavity. A leadframe is disposed between the base and the cover and adhesively bonded to both. A semiconductor device is encased within the cavity and electrically interconnected to the inner lead ends of the leadframe. The outer lead ends of the leadframe extend beyond the package perimeter and are interconnected to external circuitry.

The available space on a printed circuit board is limited and it is desirable to minimize the peripheral area of a package. The peripheral area of a leaded package extends beyond the perimeter of the package base and cover to a point defined by the outer lead portions of the leadframe.

To minimize the peripheral area of an electronic package, electrical interconnection may be through a package component as disclosed in U.S. patent application Ser. No. 08/033,596, entitled "Ball Grid Array Electronic Package" by Mahulikar et al that was filed on Mar. 19, 1993 and is incorporated by reference in its entirety herein. The ball grid array package has a metallic base coated with an electrically non-conductive layer. Conductive vias extend through apertures formed through the base. One end of the via is electrically interconnected to the semiconductor device and the other end is bonded to a solder ball for attachment to external circuitry.

In U.S. patent application Ser. No. 08/277,387 entitled "Integrally Bumped Electronic Package Components" by Deepak Mahulikar et al, that was filed Jul. 19, 1994 and is incorporated by reference in its entirety herein, ball grid array electronic packages are disclosed that do not require vias extending through a metallic substrate. The metallic substrate is coated with an electrically non-conductive layer and circuit traces are formed on this electrically non-conductive layer to electrically interconnect a semiconductor device to external solder balls.

While the ball grid array electronic packages disclosed in the above patent applications have proven satisfactory, the Applicants have developed electronic package components that improve the electrical properties, the thermal characteristics and the reliability of the package.

SUMMARY OF THE INVENTION

Accordingly, it is an object of the present invention to provide components for an electronic package that improve the electrical performance of the package, the thermal performance of the package and the package reliability.

It is a feature of the invention that in one embodiment, electrically conductive circuit traces are formed on a component of the package and directly interconnect input/output pads of an integrated circuit device to external circuitry. In a second embodiment of the invention, both the base component and the cover component include a seal ring bondable to a hermetic sealant. In yet another embodiment of the invention, the component includes an integral heat sink to improve thermal dissipation or the heat sink has a central channel to receive a thermal fluid.

Among the advantages of the invention are that the electronic packages do not require wire bonds and are not subject to device failure due to breakage of the wire bonds. Another advantage is that the package components are suitable for hermetic sealing to enhance reliability. Another advantage of the invention is a heat sink to improve thermal dissipation.

In accordance with the invention, there is provided a component for an electronic package having a metallic substrate coated with an electrically non-conductive layer. A first plurality of conductive circuit traces are formed on a surface of the component. The circuit traces are adapted to be bonded directly to the input/output pads of an integrated circuit device and bonded such as by soldering to a second plurality of circuit traces.

In a second embodiment of the invention, there is provided a component for an electronic package having a metallic substrate coated with a first electrically non-conductive layer. A first plurality of conductive circuit traces are formed on a peripheral surface of this component with a second electrically non-conductive layer formed about the periphery of the component overlying the mid-portion of the circuit traces.

In yet another embodiment of the invention, there is provided a component for an electronic package. This package includes a metallic substrate having first and second opposing surfaces. An integrated circuit device is bonded directly to the first surface and either a plurality of protrusions extend from the periphery of the second surface of the substrate with a central portion of the second surface essentially free of protrusions or a plurality of protrusions extend outward from the center of this second surface and run generally parallel to the second surface.

In yet another embodiment of the invention, there is provided a base component and a cover component bonded together to define a cavity. A portion of this cavity is occupied by an integrated circuit device. Essentially the remainder of the cavity is filled with a thermally conductive, electrically non-conductive fluid. At least one aperture formed in either the base component or the cover component communicates this fluid to an internal channel of a heat sink bonded to the aperture containing component.

The above stated objects, features and advantages will become more apparent from the specification and drawings that follow.

DETAILED DESCRIPTION

Figure 17:
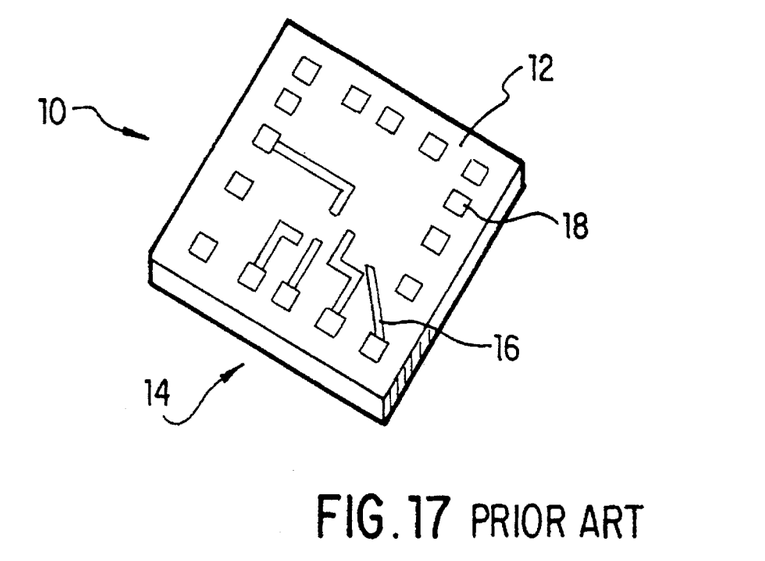
FIG. 17 illustrates an integrated circuit device as known from the prior art.

FIG. 17 illustrates an integrated circuit device 10 as known from the prior art. Also known as a semiconductor chip or semiconductor die, the integrated circuit device 10 has a front side 12 and an opposing back side 14. The integrated circuit device 10 is formed from a semiconductor material such as silicon, germanium or gallium/arsenide. By selectively doping portions of the front side 12 with other materials, circuitry 16, that is only partially illustrated in FIG. 17, is formed in the front side. The circuitry 16 terminates at metallized input/output (I/O) pads 18. The metallization is selected to facilitate electrical interconnection of the I/O pads 18 to external circuitry. For example, if wire bonds are to be attached by thermal compression bonding, the metallization may be aluminum. If the I/O pads 18 are to be directly soldered to a substrate as in flip chip or C4 (controlled collapse chip connection), the metallization may be palladium.

The opposing back side 14 of the integrated circuit device 10 is usually the semiconductor material or a metallization such as nickel or gold.

Figure 1:
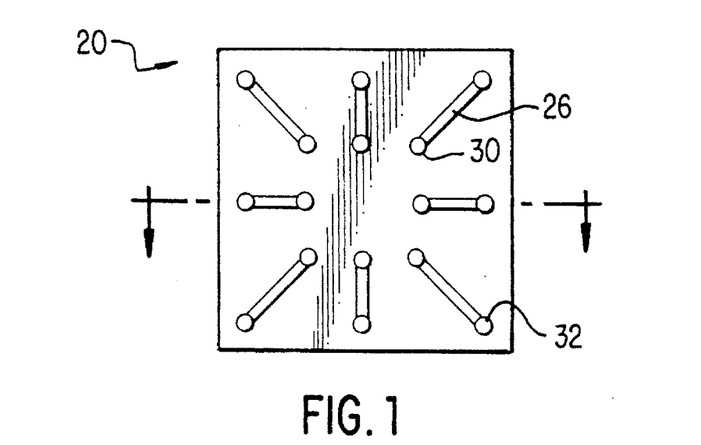
FIG. 1 shows in top planar view a cover component for an electronic package in accordance with the present invention.

FIG. 1 illustrates in top planar view a component 20 for an electronic package that is bonded directly to the I/O pads of an integrated circuit device. The component 20 is illustrated in cross-section in FIG. 2. Throughout this patent application, the "major surfaces" refer to those illustrated in FIG. 1, that is the length and width of the various components. The perpendicular sides corresponding to FIG. 2 are not considered a "major surface".

Figure 2:
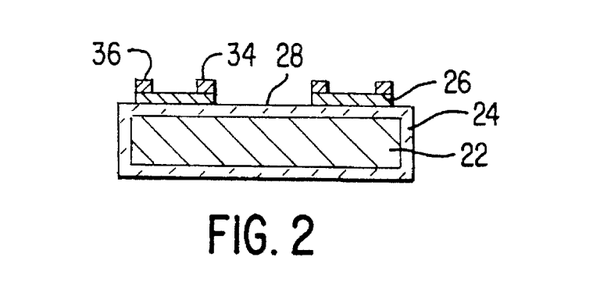
FIG. 2 shows in cross-sectional representation the cover component of FIG. 1.

Referring to both FIG. 1 and FIG. 2, the component 20 has a substrate 22 formed from any material having a coefficient of thermal expansion between that of silicon ($50\times10^{-7}/°C.$) and that of aluminum ($240\times10^{-7}/°C.$). When the substrate 22 is metallic, the substrate is coated with an electrically non-conductive layer 24. By metallic, it is meant that the substrate 22 is a metal, metal alloy, metal based composite or metal based compound and generally considered to be electrically conductive. Suitable materials for the metallic substrate include copper, aluminum, iron, nickel, molybdenum and alloys thereof. Copper, aluminum and alloys thereof are preferred due to high thermal conductivity. Aluminum alloys are most preferred due to the added advantage of light weight.

Suitable clads for the substrate 22 include copper/invar/copper and copper/molybdenum/copper. The thickness of each cladding layer and the cladding core is selected to achieve a composite having a desired coefficient of thermal expansion and a desired coefficient of thermal conductivity as described in detail in U.S. Pat. No. 5,015,803 to Mahulikar et al. that is incorporated by reference in its entirety herein.

Suitable non-metals for the substrate 22 include ceramics such as aluminum oxide, aluminum nitride, silicon carbide, and composites thereof and glasses such as borosilicates.

When the metallic substrate 22 is aluminum or an aluminum based alloy, the non-conductive layer 24 is typically an anodic film as disclosed in U.S. Pat. Nos. 4,939,316 and 5,066,368 to Pasqualoni et al that is incorporated by reference in its entirety herein.

The anodic film 24 is from about 0.013 millimeter to about 0.076 mm (0.0005–0.003 inch) and typically from about 0.013 mm to about 0.05 mm (0.0005–0.002 inch) to electrically isolate circuitry without significantly reducing thermal conductivity.

When the metallic substrate is a metal that is not anodizable, the non-conductive layer 24 may be an oxide, nitride or carbide layer. These layers are readily formed by heating in an effective gaseous atmosphere, by chemical vapor deposition or physical vapor deposition. Alternatively, the non-conductive layer 24 may be a thin layer of a polymer or a glass. Flexible polymers such as polyimides, modified epoxies and silicones that flow when stressed are particularly preferred. These materials compensate for coefficient of thermal expansion differences between the electronic package and the surface to which that package is mounted thereby improving the reliability of the mounting.

A first plurality of conductive circuit traces 26 is formed on a first surface 28 of the metallic substrate 22. While the first plurality of conductive circuit traces 26 may be formed on the first surface 28 by any desired means, including lamination or adhesive bonding, it is preferred that the circuit traces 26 be in direct contact with the non-conductive layer 24 and be formed by a process such as chemical vapor deposition, physical vapor deposition, electroless plating or electrolytic plating.

The circuit traces 26 have an interior termination end 30 and an exterior termination end 32 and are formed from an electrically conductive material or combination of materials and are predominantly copper or a copper alloy.

The interior termination ends 30 are adapted to be soldered directly to the I/O pads of an integrated circuit device and are in a pattern aligned with those I/O pads. A first bump 34 may be deposited on the interior termination ends 30. Typically, the first bump will be a low melting alloy such as a lead/tin alloy, although an electrically conductive adhesive or an electrically conductive solder glass may also be utilized. Alternatively, the first solder bump may be deposited on the I/O pads of the integrated circuit device.

The solder need not be homogeneous. Alternatives for the first solder bumps 34 include solder covered metallic spheres, such as solder coated copper balls. The first-solder bumps may be gold or another material built up on the I/O pads 18 by a process such as evaporation, sputtering, plating or wire bumping. In wire bumping, a metallic wire, typically gold, aluminum or an alloy thereof, is thermocompression or thermosonically bonded to the I/O pad forming a bond ball with a wire tail extending therefrom. The wire tail is subsequently removed. Conductive adhesives such as a silver powder filled epoxy can also be used.

Second solder bumps 36 are provided on the exterior termination end for bonding to a second plurality of circuit traces (not shown) that may constitute part of the electronic package or an external circuit. The composition of the second solder bumps 36 is, independently, any one of those specified for the first solder bump 34. Alternatively, the second solder bump may be formed on the second plurality of circuit traces in alignment with the exterior termination ends 32.

Figure 3:
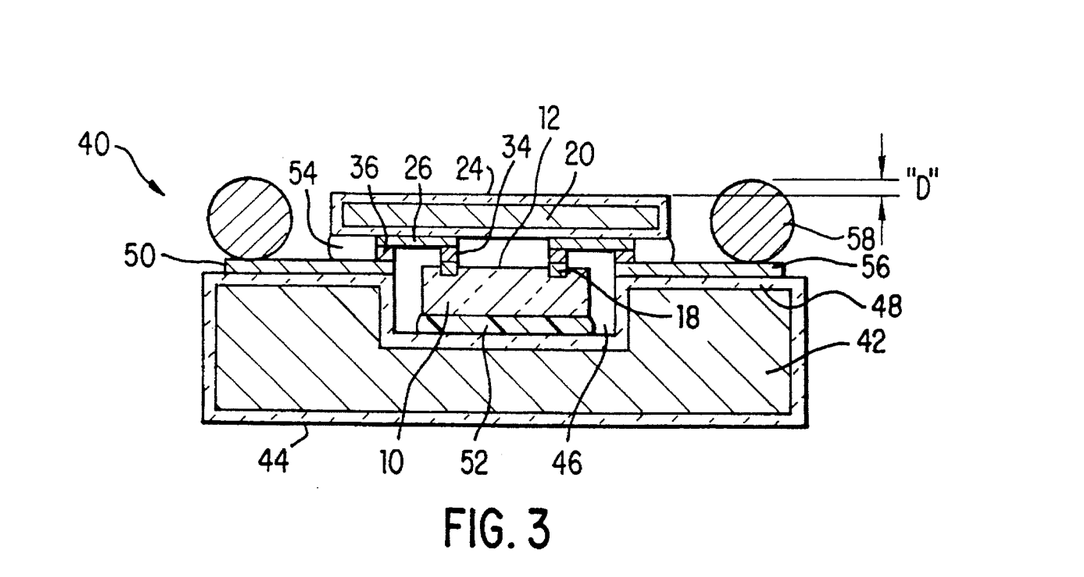
FIG. 3 shows in cross-sectional representation the cover component of FIG. 1 and FIG. 2 incorporated into a ball grid array package.

FIG. 3 illustrates an electronic package 40 utilizing the component 20 as a cover component. The electronic package 40 includes a base component 42 that may be any desired material such as a metal, polymer or ceramic. Preferably, the base component 42 is also formed from a metal, metal alloy, metal composite or metal compound to take advantage of the high thermal conductivity of these materials. When electrically conductive, the base component 42 is coated with a non-conductive layer 44 as described above for the non-conductive layer 24.

The base component 42 has a centrally disposed integrated circuit device receiving portion 46 and a peripheral portion 48. Formed on the peripheral portion 48 is a second plurality of circuit traces 50 having characteristics similar to the first plurality of circuit traces 26.

An integrated circuit device 10 is bonded to the receiving portion 46 of the base component 42 by a die attach 52. The die attach 52 is any suitable low melting temperature solder, sealing glass or adhesive. One preferred material is an epoxy that is filled with a thermally conductive material such as silver powder. I/O pads 18 on the front side 12 of the integrated circuit device 10 are bonded to the first plurality of circuit traces 26 by the first bumps 34.

The second solder bumps 36 electrically interconnect the first plurality of circuit traces 26 to the second plurality of circuit traces 50. While the second solder bumps 36 bond the cover component 20 to the base component 42, to ensure tenacious adhesion, a polymer adhesive 54 is preferably employed to enhance the bond. This polymer adhesive 54 is any suitable material that bonds to both the non-conductive layers 24, 44 and to the conductive circuit traces 26, 50. One suitable material is a thermosetting epoxy.

The polymer adhesive 54 is bonded to a mid-portion of the second plurality of circuit traces 50. Bonded to an exterior portion 56 is a solder ball 58. The solder ball 58 is any suitable solder for joining the electronic package 40 to external circuitry and is typically a lead/tin alloy.

To minimize stress applied to the integrated circuit device 10 through the first solder bumps 34, the lid component 20 is preferably as thin as possible. Typically, the lid component 20 thickness is from about 0.13 mm to about 0.51 mm (0.005–0.02 inch). The thickness of the cover component 20 and the diameter of the solder balls 58 are selected so the solder balls 58 extend a distance, "D" of at least 0.13 mm (0.005 inch) and preferably from about 0.18 mm to about 0.25 mm (0.007–0.01 inch) above the outward facing surface of the cover component 20.

The electronic package 40 has many advantages over conventional ball grid array packages that utilize wire bond interconnections. The inductance is lower because the wire bonds are replaced with a buried microstrip structure. The lengths of the first circuit traces 26 are shorter than that of typical wire bonds because the circuit traces run parallel to the surface of the semiconductor device 10 rather than running in an elevated arc as with wire bonding. Further, there is no problem with wire sweep and other issues related to wire fragility and the bond loop height is not a reliability concern. Bond loop height is significant in metal electronic packages because if the top of the arc contacts a metallic cover, an electrical short circuit develops. In addition, both the height and the shape of the bond wires affect wire reliability. This electronic package 40 is ideal for the removal of heat from the integrated circuit device 10. Both the metallic lid and the metallic base are directly connected to the device and constitute a dual heat sink. Further, the outward facing surface of the cover may be metallized for soldering to a printed circuit board.

Figure 4:
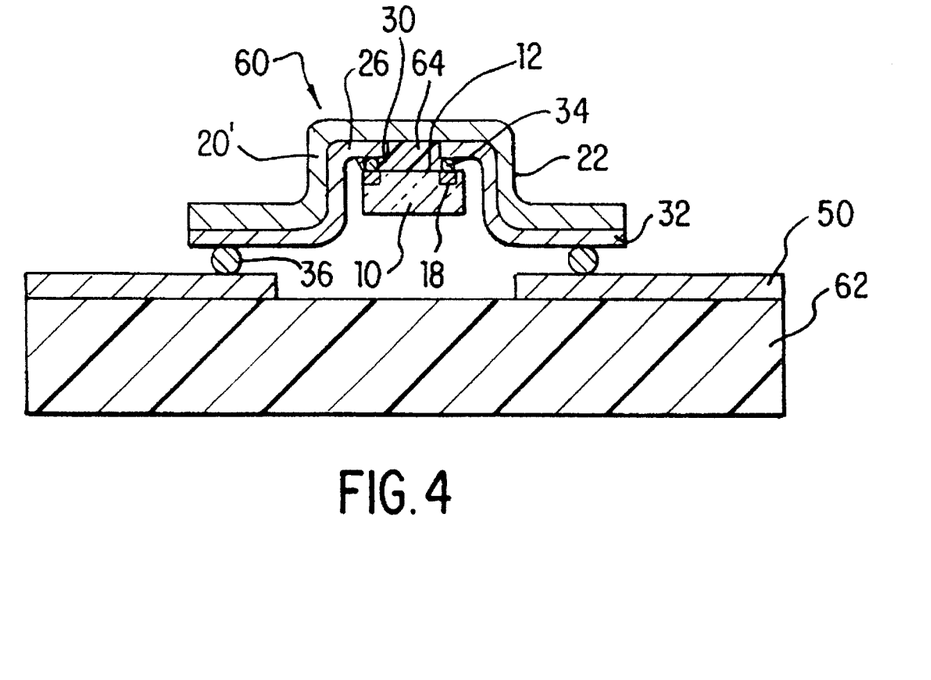
FIG. 4 shows in cross-sectional representation another embodiment of the cover component of FIG. 1 and FIG. 2.

With reference now to FIGS. 1 and 4, an electronic package 60 is formed by mechanically deforming the component 20 into a cup-shaped component 20'. The first plurality of conductive circuit traces 26 is formed on the metallic substrate 22. A non-conductive layer separates the first circuit traces 26 from the metallic substrate 22. Alternatively, the substrate 22 may be a heat formable plastic eliminating the need for the intervening non-conductive layer. Of course, thermal conductivity is enhanced when the substrate 22 is metallic.

The first circuit traces 26 are formed on the substrate 20 prior to deformation and are capable of being mechanically shaped without cracking. While an aluminum or aluminum alloy substrate with an anodization layer is acceptable for this embodiment, it is preferred that the metallic substrate 22 be copper or a copper based alloy and that the non-conductive layer be a dielectric organic polymer, such as a polyimide or an epoxy. The dielectric layer is applied to the metallic substrate 26 by a suitable process such as dipping or spraying and has a thickness on the order of 0.025 mm to 0.075 mm (0.001–0.003 inch). If a polymer adhesive is required to laminate the circuit traces, an epoxy adhesive is suitable.

First bumps 34 electrically interconnect the I/O pads 18 to the interior termination ends 30 of the first circuit traces 26.

The exterior termination ends 32 are electrically interconnected to a second plurality of circuit traces 50 by second solder bumps 36. The second plurality of circuit traces 50 may be formed on a base component or on a printed circuit board substrate 62 such as a glass filled epoxy resin.

The space between the front side 12 of the integrated circuit device 10 and the substrate 20 may be filled with a compliant polymer 64, such as a silicone gel, to enhance the reliability of the first bumps 34. Filling the entire package cavity with the compliant polymer enhances the reliability of the second solder bumps 36.

The advantages of the electronic package 60 include low cost and amenability to high volume manufacturing methods. Since the first plurality of conductive circuit traces 26 are deposited on a planar surface, high resolution of the circuitry is obtained. After deformation of the substrate 22, the high density circuitry accurately fills the cupped region of the package. The depth of the cup may be accurately controlled during forming. As a result, a similar component 20 is used for many different sizes of integrated circuit devices by merely changing the deformation tool dimensions.

Figure 18:
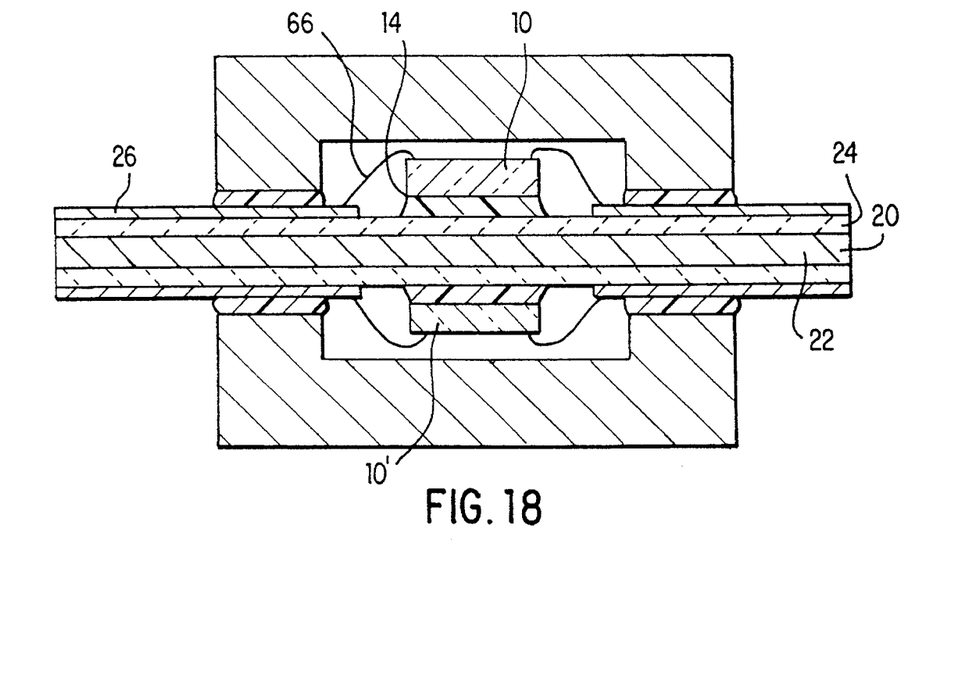
FIG. 18 illustrates in cross sectional representation the component of FIG. 1 used to support a plurality of integrated circuit devices.
Figure 19:
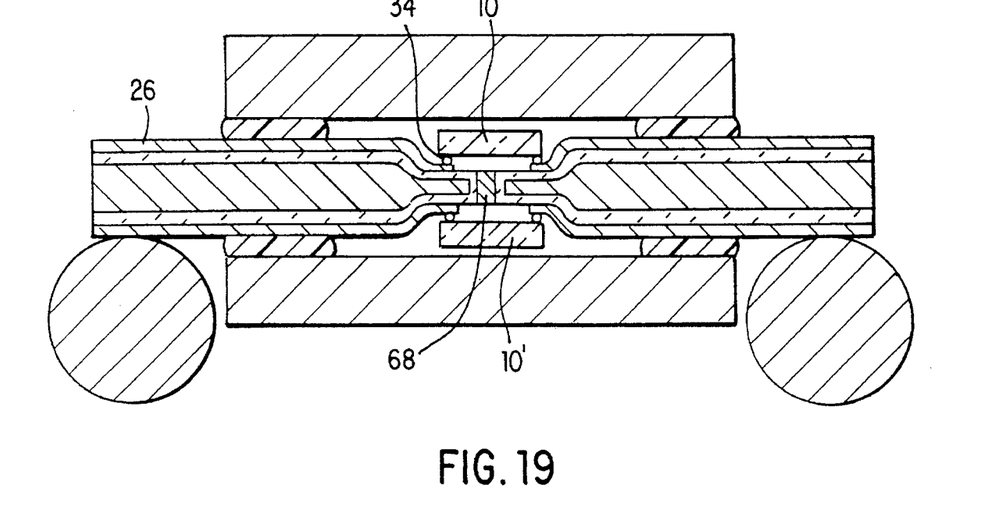
FIG. 19 illustrates in cross sectional representation a second embodiment in which the component of FIG. 1 is used to support a plurality of integrated circuit devices.

FIGS. 18 and 19 illustrate that the component 20 may be an internal component rather than a part of the package base or cover. The component 20 has a substrate 22, preferably a metal coated with a non-conductive layer 24. A plurality of integrated circuit devices 10, 10' are bonded to opposing sides of the component 20. The back side 14 of the integrated circuit devices may be bonded to the component 20 and electrically interconnected through wire bonds 66 as illustrated in FIG. 18. The wire bonds connect the I/O pads 18 to the first plurality of circuit traces 26. The first circuit traces 26 provide electrical interconnection to external circuitry through solder balls, terminal pins, a lead frame or the like.

In FIG. 19, the integrated circuit devices 10, 10' are bonded and electrically interconnected to the first plurality of circuit traces 26 through first solder bumps 34. One or more conductive vias 68 may be included to electrically or thermally interconnect the devices.

Figure 5:
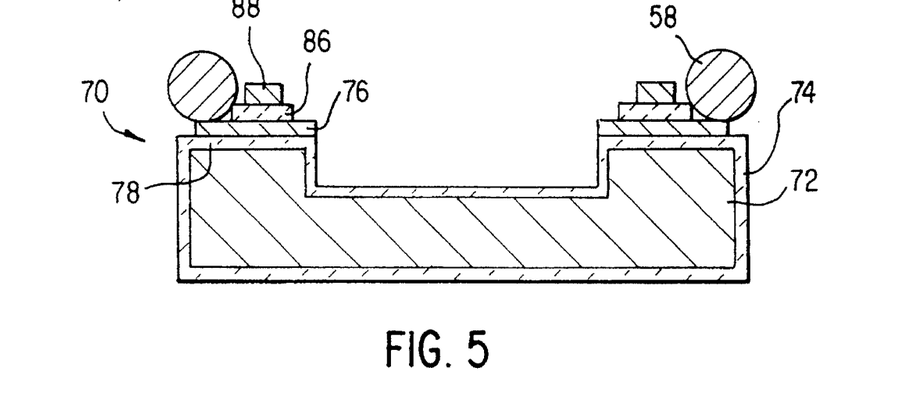
FIG. 5 shows in cross-sectional representation an electronic package component for a hermetic ball grid array package.
Figure 6:
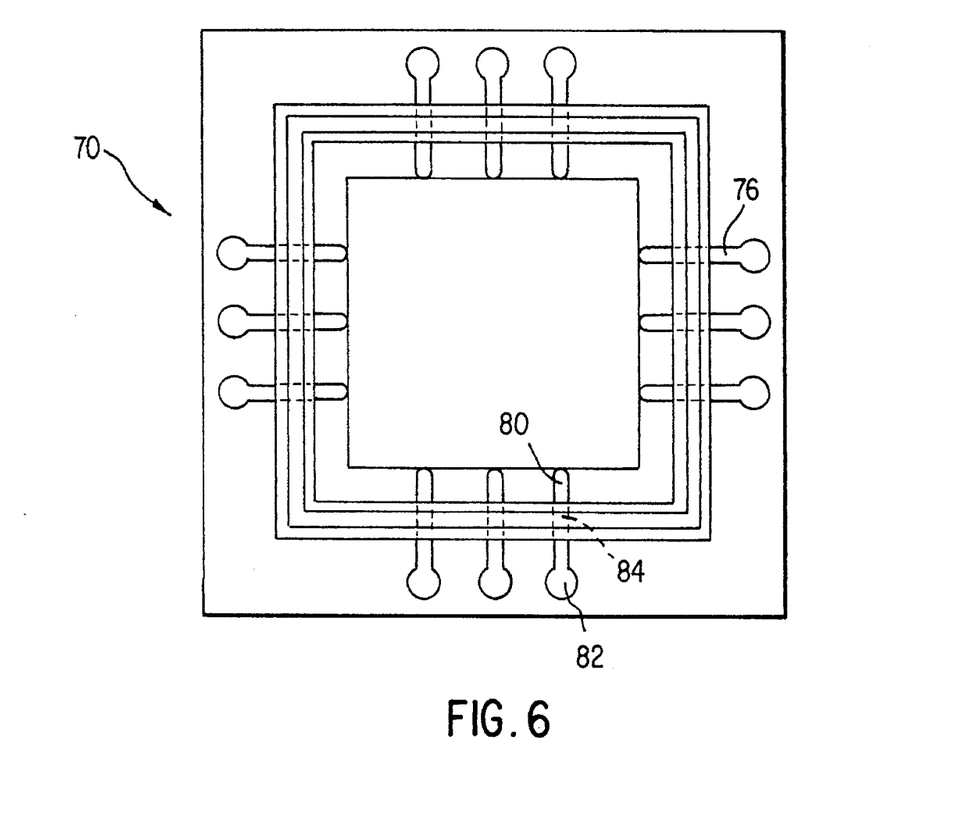
FIG. 6 shows in top planar view the component of FIG. 5.

The component 70 illustrated in cross-section in FIG. 5 and in top planar view in FIG. 6 provides hermeticity. Moisture is detrimental to the operation of an integrated circuit device. Moisture combines with byproducts of package assembly such as chloride ions to form corrosive species that corrode circuitry on the integrated circuit device and the bond wires. Electronic packages that are hermetic effectively block the transfer of moisture to the integrated circuit device and bond wires.

The component 70 has a metallic substrate 72 coated with a non-conductive layer 74. The metallic substrate is any suitable metal, metal alloy, metal composite or metal compound, preferably aluminum or an aluminum alloy with the non-conductive layer 74 an anodization layer. Alternatively, the substrate 72 may be a dielectric such as a ceramic, for example, aluminum oxide, aluminum nitride or silicon carbide. When a dielectric substrate is employed, the non-conductive layer may be omitted.

A first plurality of circuitry traces 76 is formed on a peripheral surface 78 by any suitable process such as chemical vapor deposition, physical vapor deposition or jet vapor deposition as described more fully in U.S. Pat. No. 5,256,205 to Schmitt, III et al that is incorporated by reference in its entirety herein. Alternatively, the circuit traces 76 may be formed by an electroless or electrolytic plating process.

The circuit traces 76 have an interior end 80, an opposing exterior end 82 and an intervening mid-portion 84. A dielectric layer 86 is formed over the mid-portion 84 of the circuit traces 76 by a vapor deposition process such as plasma vapor deposition or jet vapor deposition. This dielectric layer may be any suitable inorganic dielectric such as aluminum oxide or aluminum nitride.

A metallization layer 88 is deposited on the dielectric layer 86 by a suitable process such as vapor deposition. The metallization layer 88 is any solderable metal such as a palladium/nickel alloy or nickel. A ceramic or metallic lid may then be joined to the component 70 by soldering or glass sealing. Solder balls 58 are available for electrical interconnection to external circuitry. However, other means for electrical interconnection through the exterior ends, such as brazed leads or terminal pins, may also be employed.

Figure 7:
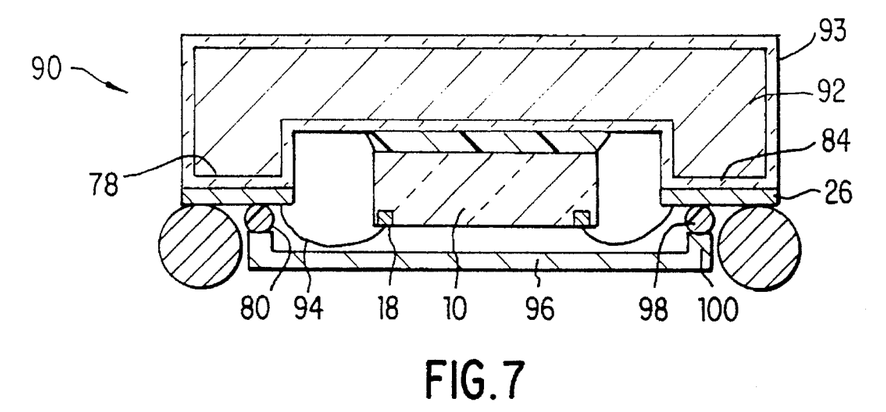
FIG. 7 shows in cross-sectional representation another component for a hermetic ball grid array package.

Another hermetic electronic package 90 is illustrated in cross-section in FIG. 7. The base component 92 to the package 90 is shown in top planar view in FIG. 8. As described hereinabove, the base component 92 is preferably a metallic substrate and coated with a non-conductive layer 94. A first plurality of circuitry traces 26 are formed about a peripheral surface 78 of the base component 92. Wire bonds 94, thin strips of copper foil as utilized in tape automated bonding (TAB), in-line circuitry or any other electrical interconnection connects the I/O pads 18 to the interior end 80 of the first plurality of conductive circuit traces 26.

Figure 8:
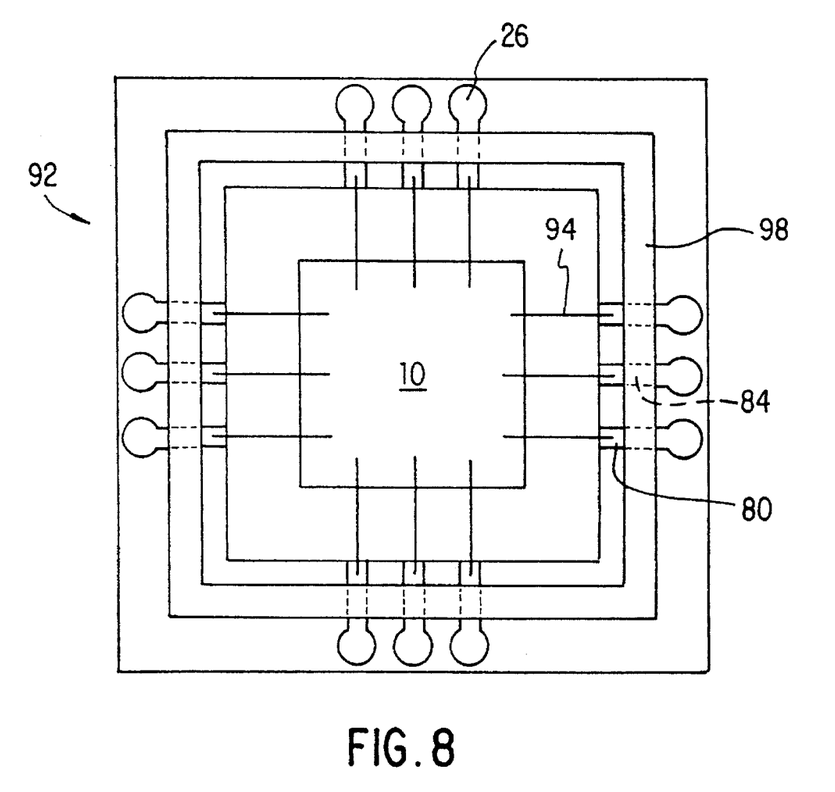
FIG. 8 shows in top planar view the hermetic ball grid array package component of FIG. 7.

The cover component 96 is bonded to the base component 92 by a sealing glass 98. The sealing glass 98 bonds to a peripheral surface 100 of the cover component 96 and to the mid-portion 84 of the first plurality of conductive circuit traces 26, as well as to the dielectric layer 94, if present or else to the substrate 92 if the substrate 92 is non-conductive.

When the substrate 92 is aluminum or an aluminum based alloy, one suitable sealing glass has the composition, by weight:

32%–50% $SiO_2$
4%–27% $Na_2O$
4%–27% $K_2O$
2%–8% $BaO$
2%–8% $SrO$
4%–30% $TiO_2$
up to 5% $Li_2O$
up to 7% $ZnO$
up to 2% $ZrO_2$
up to 2% $Al_2O_3$ as disclosed in U.S. Pat. No. 5,023,398 to Mahulikar et al that is incorporated by reference in its entirety herein. In addition to sealing glasses, devitrifying ceramics and ceramizable sealing glasses may also be employed.

Figure 9:
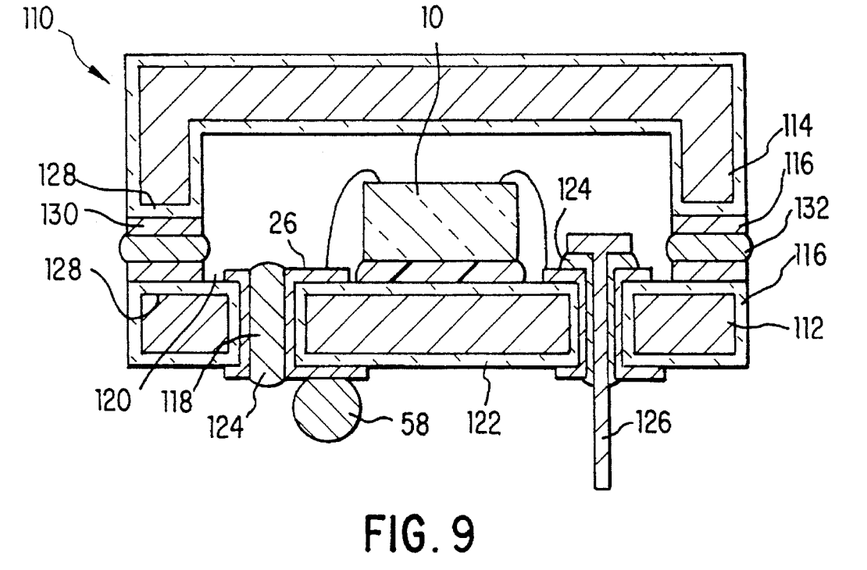
FIG. 9 shows in cross-sectional representation a hermetic array package.

A hermetic electronic package 110 is illustrated in cross-section in FIG. 9. As with preceding embodiments, the hermetic electronic package 110 includes a base component 112 and a cover component 114, both of which are preferably a metal, metal alloy, metal composite or metal compound and coated with a non-conductive layer 116. Preferably, the base component 112 and cover component 114 are formed from aluminum or an aluminum alloy and the non-conductive layer 116 is an anodization layer. Optionally, either the base component 112 or the cover component 114 or both, may be formed from an electrically non-conductive material such as a ceramic or a polymer resin, eliminating the need for the non-conductive layer 116.

A plurality of vias 118 are formed through either the base component 112 or the cover component 114. A first plurality of conductive circuit traces 26 are formed on a surface 120 of either the base component 112 or the cover component 114. The first plurality of circuit traces extend along the walls of the vias 118 to an opposing surface 122 of either the base component 112 or the cover component 114. An integrated circuit device 10 is electrically interconnected to the first plurality of circuitry traces by any suitable means as described above, for example, wire bonds, TAB or in-line circuitry.

In one embodiment, the vias 118 are then filled with a solder paste 124 that is heated to reflow forming a solid plug that seals the via 118. A solder ball 58 is bonded to the first circuit traces on the opposing surface 122.

Alternatively, a terminal pin 126 extends through the via 118 and is joined to the first circuit traces 26 by solder 124. The solder extends along the shank of the terminal pin 126 through the via 118 to provide a hermetic seal.

A peripheral portion 128 of both the base component 112 and the cover component 114 is coated with a metallization 130 of a solderable material such as copper or a copper/nickel alloy. A solder seal 132 hermetically joins the base component 112 to the cover component 114, completing the package 120.

Figure 10:
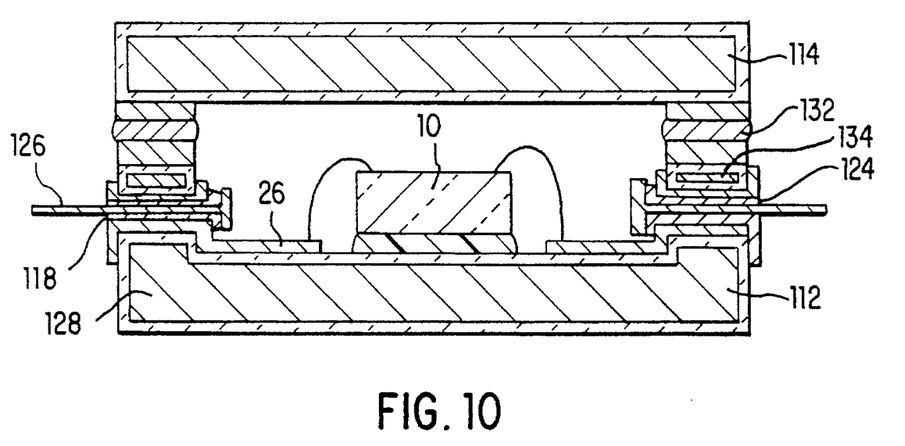
FIG. 10 shows in cross-sectional representation a hermetic package having side terminal pins.

If the base component 112 has side walls 134 or a brazed ring frame (not shown), the terminal pins 126 may extend outward, in generally planar orientation with the base and cover components as illustrated in FIG. 10. As with the preceding embodiments, first circuit traces 26 electrically interconnect the integrated circuit device 10 to the terminal pins 126.

The solder 124 used to fill the vias 118 in FIGS. 9 and 10 may be either the same or different than the solder seal 132 used to join the base component 112 to the cover component 114. If the same solder is used, then the lid attach and via filling operations are done at the same time.

If a sequential process is desired, then the solder 124 should have a higher melting point than the solder seal 132 recognizing that the solder seal 132 is the last assembly operation. Alternatively, the solder seal 132 may be replaced with a sequential localized heat seam sealing operation to prevent any melting of other solder joints in the package. This process limits the heat applied to a very local localized portion of the peripheral portion 128 of the package components.

Figure 11:
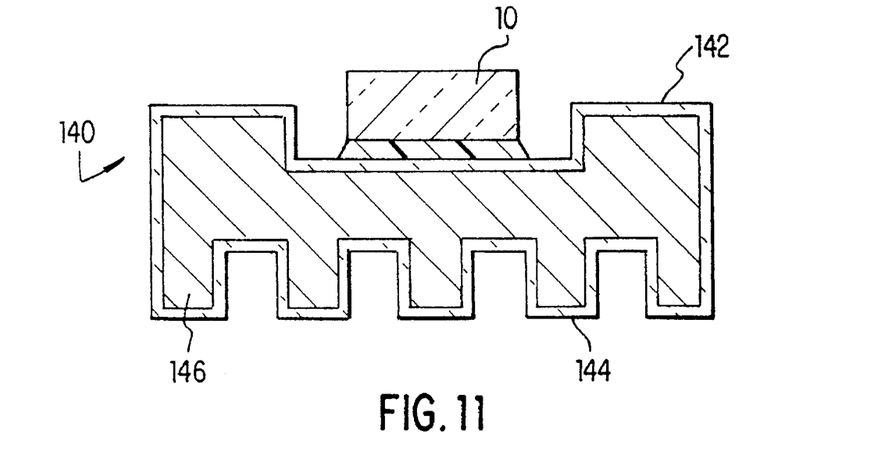
FIG. 11 shows a base component for an electronic package having an integral heat sink.
Figure 12:
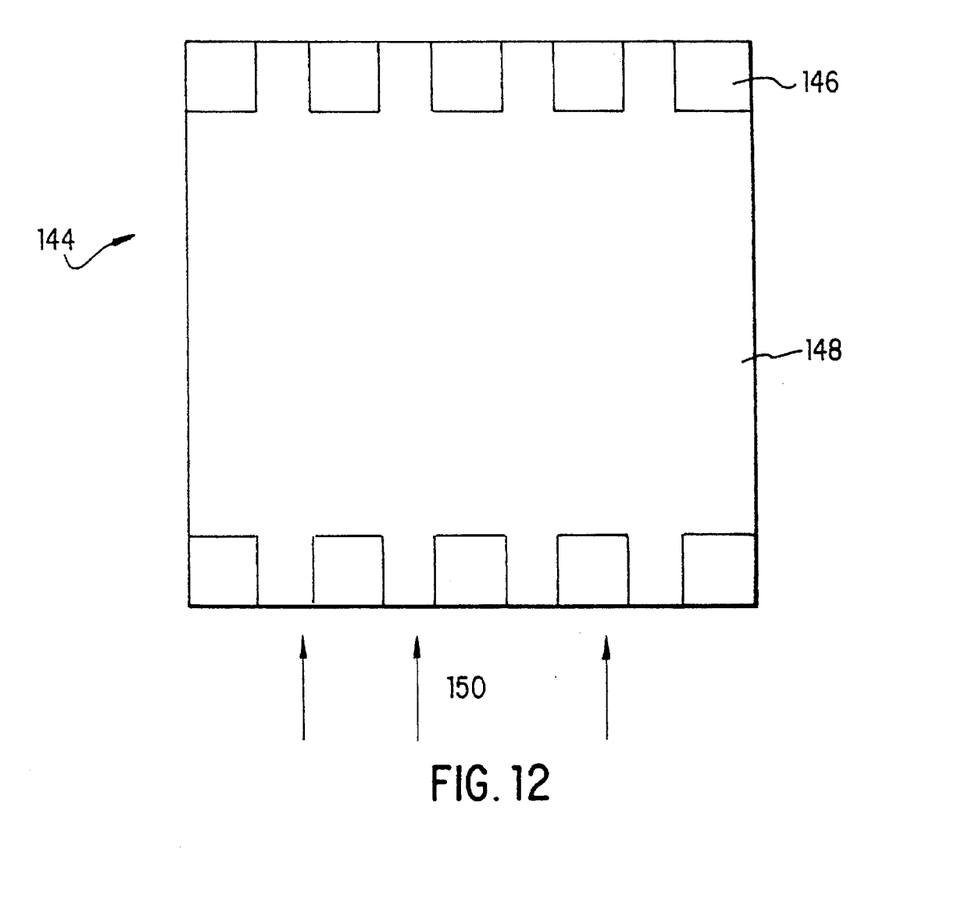
FIG. 12 shows in top planar view the integral heat sink of FIG. 11.
Figure 22:
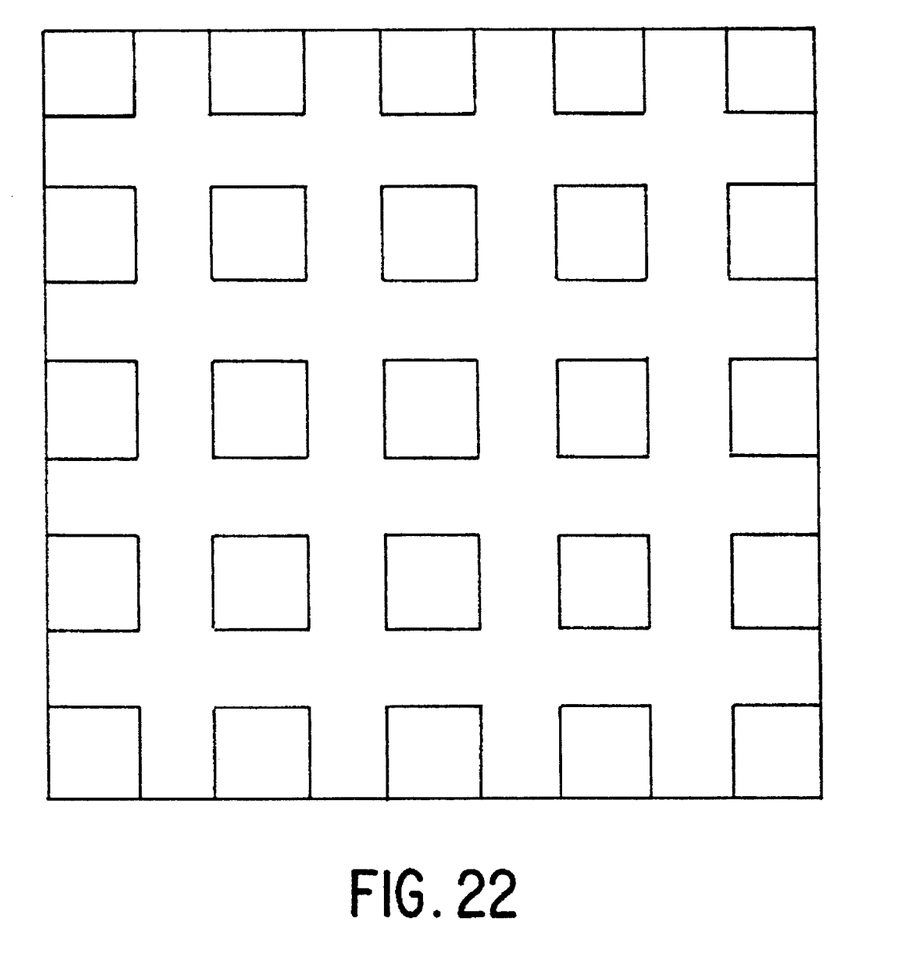
FIG. 22 shows in top planar view the integral heat sink of FIG. 11 with protrusions extending across the central portion.

The electronic package components of the invention are highly effective to dissipate heat from an integrated circuit device. The dissipation of heat may be further enhanced by forming a heat sink integral with either the base component, the cover component or both. One such component is illustrated in cross-sectional representation in FIG. 11 and in top planar view in FIG. 12. The thermally enhanced component 140 has a first surface 142 and an opposing second surface 144. An integrated circuit device 10 is bonded to the first surface 142. A plurality of protrusions 146 extend outward from the periphery of the second surface 144 to a height of from about 1 mm to about 25 mm. A central portion 148 of the second surface 144 is essentially free of the protrusions 146 or the protrusions may extend through the central portion in a waffle-like pattern as illustrated in FIG. 22. A forced air draft 150 travels across the second surface 144 in a direction generally perpendicular to the rows of protrusions 146. The configuration with the central portion free of protrusion is superior to fins extending all the way across the second surface 144 because the central portion 148 is then used for marking or pick and place.

Figure 13:
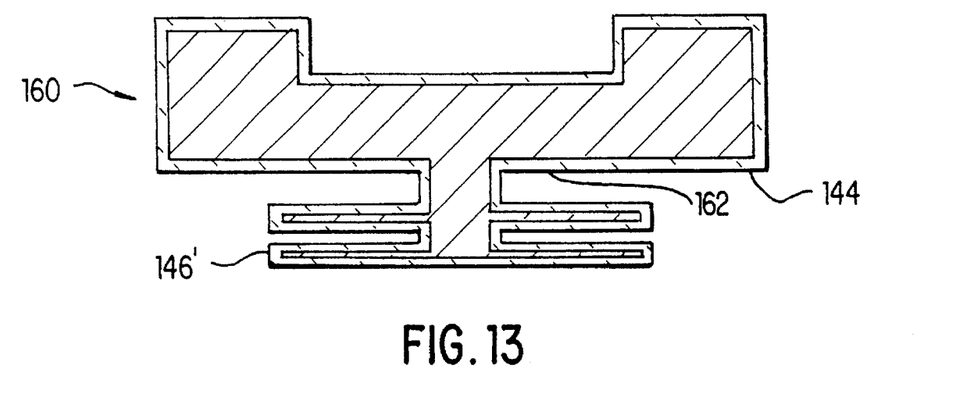
FIG. 13 shows in cross-sectional representation a base component having another integral heat sink.
Figure 14:
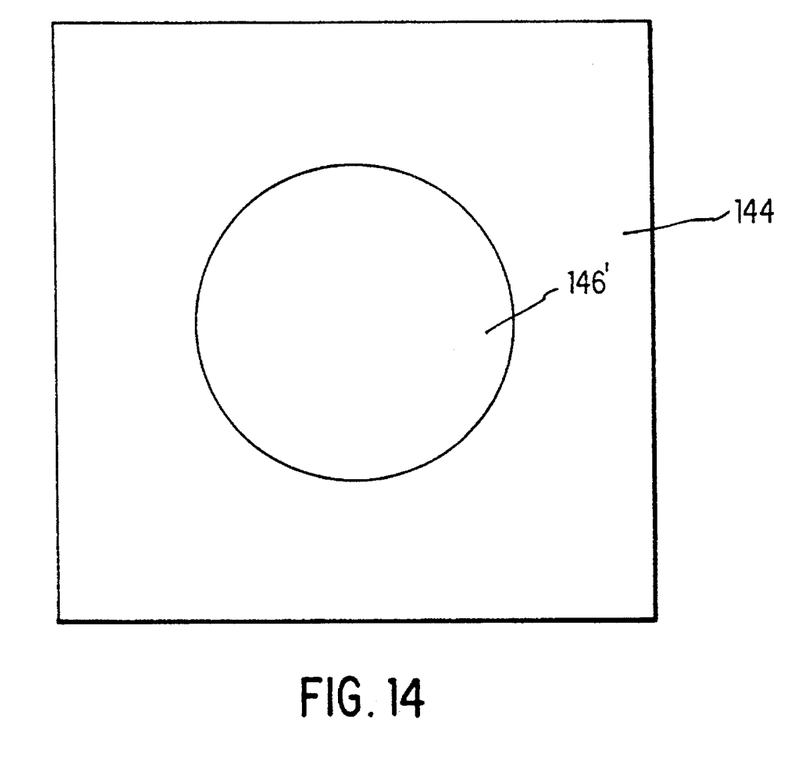
FIG. 14 shows in top planar view the integral heat sink of FIG. 13.

A second thermally enhanced component 160 is shown in cross-sectional representation in FIG. 13 and in top planar view in FIG. 14. This structure is similar to the thermally enhanced component 140 of FIGS. 11 and 12 except that the protrusions 146' extend outward from a central portion 162 of the second surface 144 and then extend generally parallel to the second surface.

Figure 15:
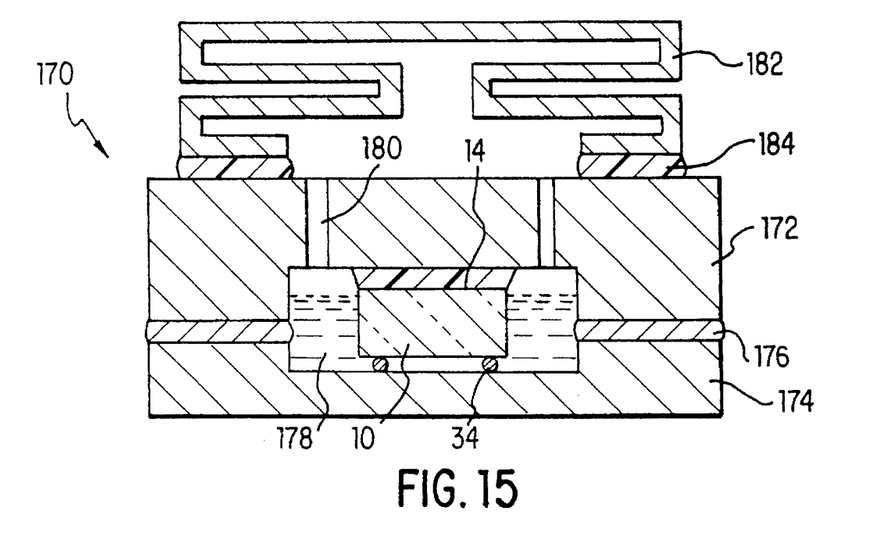
FIG. 15 shows in cross-sectional representation a thermal fluid containing heat sink for use with an electronic package.

A thermally enhanced electronic package 170 is illustrated in cross-section in FIG. 15. The package 170 has a base component 172 and a cover component 174 both formed from any desired metal, ceramic or polymer. Preferably, metallic components are employed and most preferably the metallic components are aluminum or an aluminum based alloy coated with a non-conductive anodization layer as described hereinabove. The base component 172 is bonded to the cover component 174 by a sealant 176. The sealant 176 is any effective means of joining the base 172 to the cover 174 such as a polymer adhesive, for example, a thermosetting epoxy, or a metallic solder.

An integrated circuit device 10 is encapsulated within a cavity 178 defined by the combination of the base component 172 and cover component 174. Electrical interconnection of the integrated circuit device to external circuitry is by any means described hereinabove, for example, first solder bumps 34 leading to a first plurality of conductive circuit traces (not shown) or a leadframe as illustrated in FIG. 16.

With reference back to FIG. 15, the base component, that component to which the back side 14 of the integrated circuit device 10 is bonded, contains at least one, and preferably a plurality, of apertures 180 that extend through the base component 172. A heat sink 182 formed from a thermally conductive material such as copper or aluminum and preferably having a black color to maximize emissivity, is bonded to the base component 172 by a sealant 184. This sealant may be any suitable adhesive, sealing glass or metallic solder. The remainder of the cavity 178 is then filled with a thermally conductive, electrically non-conductive fluid 186, such as perfluorinated heat transfer fluid.

As the integrated circuit device is powered by electrical signals, heat is generated. This heat is transferred into the fluid 186, causing a portion of the fluid to vaporize. The fluid vapors pass through the aperture 180 and enter the heat sink where the vapors condense and flow back into the cavity 178 establishing a heat pump.

Figure 16:
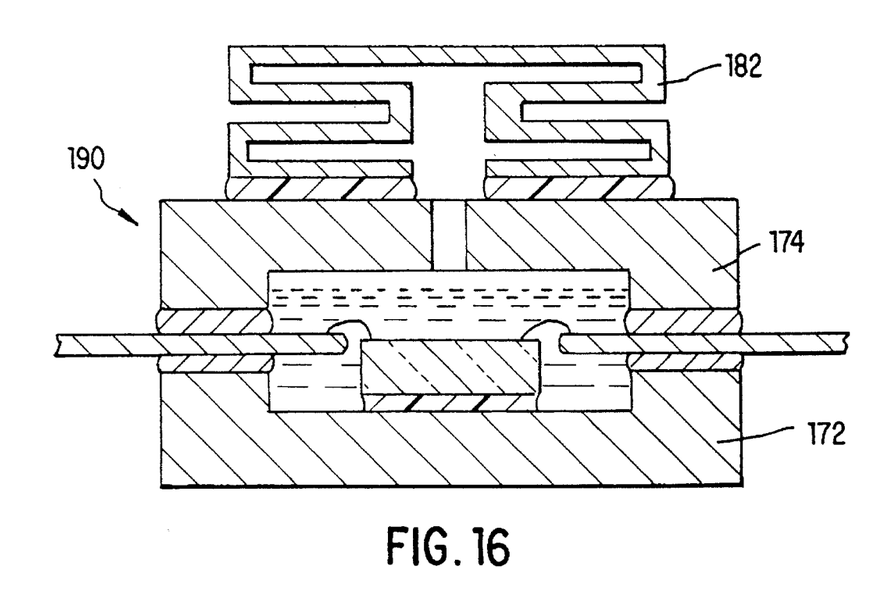
FIG. 16 shows in cross-sectional representation another thermal fluid containing heat sink in accordance with the invention.

With reference to FIG. 16, the thermally enhanced electronic package 190 illustrates the applicability of the heat sink 182 bonded to the cover component 174 rather than the base component 172.

Figure 20:
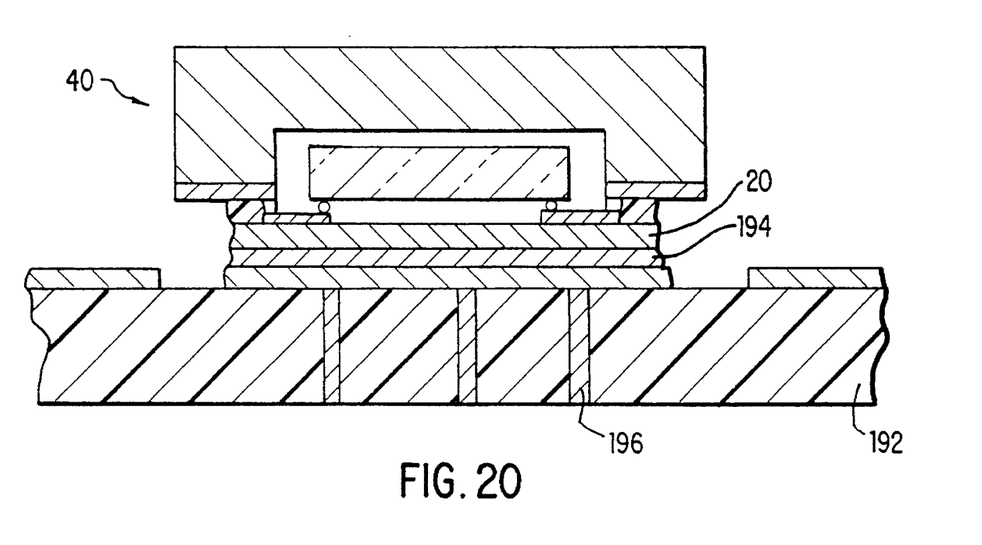
FIG. 20 illustrates in cross sectional representation thermal coupling of the component of FIG. 1 to an external heat sink.

The thermal dissipation of the electronic packages of the invention is further enhanced by thermally coupling the package components and an external heat sink. As illustrated in FIG. 20, the package 40 of FIG. 3 is thermally coupled to a printed circuit board 192 or other external substrate by forming a bond 194 between the component 20 and the printed circuit board 192. The bond 194 is a metallic solder, silver filled epoxy, thermal grease or any other suitable high thermal conductivity adhesive.

Thermal vias 196, such as copper filled through holes, may contact the component 20 to further enhance thermal dissipation. In the package 60, as illustrated in FIG. 4, and other packages having the back side 14 of the integrated circuit device exposed to external components, the thermal vias 196 may be directly coupled to the back side 14 by a solder, thermally conductive adhesive or thermal grease. If a solder is employed, the back side 14 is appropriately metallized to enhance the solder bond.

Figure 21:
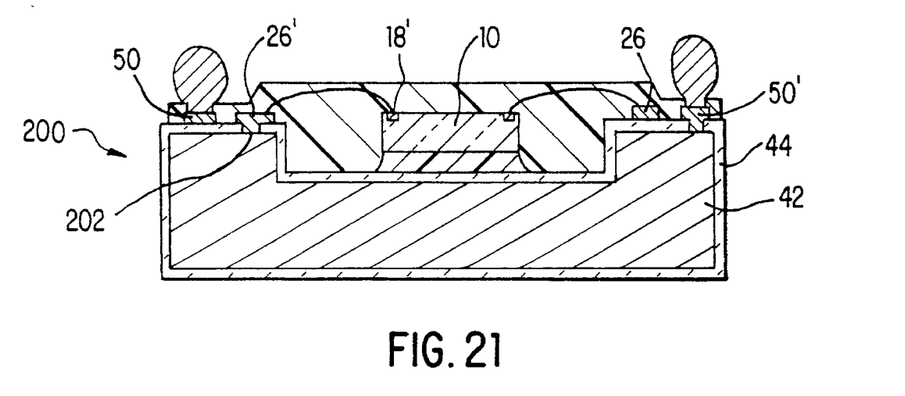
FIG. 21 shows in cross sectional representation electrical coupling of an integrated circuit device to a ball grid array electronic package.

The electronic package 200 illustrated in FIG. 21 is drawn to an embodiment in which the integrated circuit device 10 is electrically coupled to a metallic base component 42. The metallic base component 42 is coated with an electrically non-conductive layer 44 as described above. The electrically non-conductive layer 44 is discontinuous and has gaps 202 disposed between the metallic base component and a portion of the first plurality of circuit traces 26' and a portion of the second plurality of circuit traces 50'. The gaps 202 are formed by mechanical or chemical removal or laser ablation of desired portion of the non-conductive layer 44. Alternatively, the selected portions of the metallic base component 42 are masked or otherwise prevented from receiving the non-conductive layer 44. When the first and second circuit traces 26', 50' are deposited, the circuit traces fill the gap electrically coupling selected circuit traces 26', 50' to the metallic base component 42. Other circuit traces 26, 50 are electrically isolated from the metallic base component 42 by an underlying portion of the non-conductive layer 44.

Selected I/O pads 18' of the integrated circuit device 10 are electrically interconnected to the first plurality of circuit traces 26' by wire bonds 94, in-line circuitry as described above, TAB bonding or any other suitable method.

While the package base 42 may constitute a floating ground, preferably, the second circuit traces 50' are electrically interconnected to an external ground. Any circuit trace location may be electrically coupled to the metallic base. Preferably, the coupled first circuit trace 26' and the coupled second circuit trace 50' are widely separated, such as being disposed on opposing sides of the integrated circuit device 10. In this manner, the ground current flows over a large area of the metallic base component leading to the following benefits:

1. There is a better distribution of current flow and lower resistance than if the ground plane was fashioned from many small individual circuit traces or wires.

2. The package "noise" is reduced, particularly at high frequencies. The voltage noise associated with ground return paths, referred to as "ground bounce" is defined by:

$$V_{noise}=L(di/dt)$$

where (di/dt) is the speed of the circuit

L is the circuit inductance

The electrically coupled circuit of the invention reduces circuit inductance resulting in reduced package noise.

While particularly drawn to ball grid array packages, the packages of the invention are equally applicable to pin grid array packages, leaded packages and lead less packages. For example, leads could be soldered to the exterior termination ends of the first plurality of circuit traces.

It is apparent that there has been provided in accordance with the present invention electronic package components particularly suited for ball grid array electronic packages that fully satisfy the objects, means and advantages set forth hereinabove. While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A component for an electronic package comprising:
    a metallic substrate coated with a flexible dielectric polymer layer; and
    a first plurality of conductive circuit traces formed on a surface of said flexible dielectric polymer layer, said first plurality of circuit traces bonded directly to the input/output pads of an integrated circuit device and to a second plurality of circuit traces.

2. The component of claim 1 wherein said flexible dielectric polymer layer is an epoxy.

3. The component of claim 1 wherein said first plurality of circuit traces are bonded to said input/output pads by a material selected from the group consisting of metals, metals alloys, conductive solder glasses, conductive polymers and solder coated metallic balls.

4. The component of claim 1 having a generally cup-shaped configuration with said integrated circuit device housed within said cup.

5. The component of claim 3 wherein said material is a lead/tin alloy.

6. The component of claim 4 wherein said input/output pads are bonded directly to said first plurality of circuit traces.

7. The component of claim 6 further including a compliant polymer disposed between said integrated circuit device and said component.

8. A component for an electronic package comprising:
    a metallic substrate coated with an electrically non-conductive layer;
    a first plurality of conductive circuit traces formed on opposing surfaces of said metallic substrate, said first plurality of circuit traces bonded directly to the input/output pads of at least two integrated circuit devices bonded to opposing surfaces of said metallic substrate and to a second plurality of circuit traces; and
    a via extending through said metallic substrate between at least two of said integrated circuit devices.

9. A component for an electronic package comprising:
    a metallic substrate coated with an electrically non-conductive layer;
    at least two integrated circuit devices bonded to opposing surfaces of said metallic substrate; and
    a first plurality of conductive circuit traces formed on opposing surfaces of said metallic substrate wherein the input/output pads of said at least two integrated circuit devices are directly soldered to said first plurality of circuit traces, said first plurality of circuit traces further bonded to a second plurality of circuit traces.

10. A package for housing an integrated circuit device comprising:
    a metallic cover component coated with an electrically non-conductive layer and having a first plurality of circuit traces formed on a surface thereon;
    a base component having an integrated circuit device receiving portion and a peripheral portion, said peripheral portion having a second plurality of circuit traces formed thereon;
    an integrated circuit device bonded to said receiving portion and soldered to said first plurality of circuit traces by a first solder joint;
    a second solder joint electrically interconnecting said first plurality of circuit traces to said second plurality of circuit traces; and
    a third solder joint electrically interconnecting said second plurality of circuit traces to an external circuit.

11. The package of claim 10 wherein said metallic cover component is aluminum or an aluminum alloy and said electrically non-conductive layer is an anodic film.

12. The package of claim 10 wherein said electrically non-conductive layer is selected from the group consisting of carbides, nitrides, oxides and dielectric polymers.

13. The package of claim 10 wherein said first plurality of circuit traces are soldered to said input/output pads by a material selected from the group consisting of metals, metals alloys, conductive solder glasses, conductive polymers and solder coated metallic balls.

14. The package of claim 13 wherein said second plurality of circuit traces are soldered to said input/output pads by a material selected from the group consisting of metals, metals alloys, conductive solder glasses, conductive polymers and solder coated metallic balls.

15. The package of claim 14 wherein said third solder joint constitutes solder balls extending beyond an outward facing surface of said cover component.

16. The package of claim 14 wherein said cover component is thermally coupled to an external heat sink.

17. The package of claim 14 wherein said base component contains a plurality of integral protrusions extending outwardly from the periphery of said base and a central portion essentially free of said protrusions.

18. The package of claim 14 wherein said base contains a plurality of protrusions extending outwardly from said base and running generally parallel to a major surface of said base.

19. The package of claim 14 wherein said base component is also metallic and a portion of said first plurality of circuit traces is electrically coupled to said metallic base component.

20. The package of claim 15 wherein said solder balls extend for from about 0.18 mm to about 0.25 mm beyond said outward facing surface of said cover component.

21. The package of claim 16 wherein said external heat sink is a printed circuit board containing at least one thermally conductive via extending from said cover component.

22. The package of claim 16 wherein said external heat sink has an internal channel that delivers a thermal fluid to said package.

23. The package of claim 19 wherein a portion of said second circuit traces is electrically coupled to said metallic base.

24. The package of claim 23 wherein said electrically coupled portion of said first plurality of circuit traces is located on an opposing side of said integrated circuit device from said electrically coupled portion of said second plurality of circuit traces.

25. A component for an electronic package comprising:
a metallic substrate coated with a first electrically non-conductive layer;
a first plurality of conductive circuit traces formed on a peripheral surface of said metallic substrate, said first plurality of circuit traces having an interior end, an exterior end and an intervening mid-portion; and
a second electrically non-conductive layer formed about the periphery of said metallic substrate overlying said mid-portion of said first plurality of circuit traces.

26. The component of claim 25 wherein said metallic substrate is an aluminum or aluminum alloy coated with an anodic film.

27. The component of claim 25 wherein said second electrically non-conductive layer is selected from the group consisting of aluminum oxide and aluminum nitride.

28. The component of claim 27 further including a metallized layer disposed on a side of said second electrically non-conductive layer opposite said intervening mid-portion.

29. The component of claim 28 wherein said metallized layer is selected from the group consisting of palladium/nickel alloys, molybdenum/manganese alloys, nickel and nickel alloys.

30. A component for an electronic package comprising:
a metallic substrate coated with an electrically non-conductive layer and having a plurality of vias extending therethrough;
a first plurality of conductive circuit traces formed on a surface of said metallic substrate and extending through said plurality of vias; and
an electrical contact disposed within said plurality of vias and electrically interconnected to said first plurality of circuit traces.

31. The component of claim 30 wherein said electrical contact is a solder plug.

32. The component of claim 30 wherein said electrical contact is a terminal pin extending perpendicular to a major surface of said metallic substrate.

33. The component of claim 31 wherein said solder plug is a lead/tin alloy.

34. The component of claim 32 wherein said electrical contact is a terminal pin extending parallel to a major surface of said metallic base component.

\* \* \* \* \*